(12) United States Patent
Chen et al.

(10) Patent No.: US 12,387,997 B2
(45) Date of Patent: Aug. 12, 2025

(54) SEMICONDUCTOR PACKAGES

(71) Applicant: Taiwan Semiconductor Manufacturing Company, Ltd., Hsinchu (TW)

(72) Inventors: Yi-Jung Chen, Yilan County (TW); Wei-An Tsao, Changhua County (TW); Tsung-Fu Tsai, Changhua County (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 804 days.

(21) Appl. No.: 17/711,060

(22) Filed: Apr. 1, 2022

(65) Prior Publication Data

US 2023/0317564 A1   Oct. 5, 2023

(51) Int. Cl.
*H01L 23/48* (2006.01)
*H01L 23/00* (2006.01)
*H01L 23/538* (2006.01)
*H01L 25/065* (2023.01)
*H01L 23/498* (2006.01)

(52) U.S. Cl.
CPC ........ *H01L 23/481* (2013.01); *H01L 23/5383* (2013.01); *H01L 23/5386* (2013.01); *H01L 24/08* (2013.01); *H01L 24/73* (2013.01); *H01L 25/0652* (2013.01); *H01L 23/49816* (2013.01); *H01L 23/49822* (2013.01); *H01L 23/49838* (2013.01); *H01L 24/16* (2013.01); *H01L 24/32* (2013.01); *H01L 2224/08147* (2013.01); *H01L 2224/16235* (2013.01); *H01L 2224/32225* (2013.01); *H01L 2224/73204* (2013.01); *H01L 2924/1431* (2013.01); *H01L 2924/1434* (2013.01); *H01L 2924/16152* (2013.01); *H01L 2924/16251* (2013.01); *H01L 2924/1632* (2013.01)

(58) Field of Classification Search
CPC ............... H01L 23/481; H01L 23/5383; H01L 23/5386; H01L 23/49816; H01L 23/49822; H01L 23/49838; H01L 24/08; H01L 24/73; H01L 24/16; H01L 24/32; H01L 25/0652; H01L 2224/08147; H01L 2224/016235; H01L 2224/32225; H01L 2224/73204; H01L 2924/1431; H01L 2924/1434; H01L 2924/16152; H01L 2924/16251; H01L 2924/1632
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Peniel M Gumedzoe
(74) *Attorney, Agent, or Firm* — JCIPRNET

(57) ABSTRACT

A semiconductor package includes a first integrated circuit, a plurality of first through vias and a plurality of fin-shaped through vias. The first through vias surround the first integrated circuit. The fin-shaped through vias are physically connected to the first through vias respectively, wherein the first through vias are disposed between the first integrated circuit and the fin-shaped through vias.

20 Claims, 15 Drawing Sheets

(56) References Cited

U.S. PATENT DOCUMENTS

| | | | |
|---|---|---|---|
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2020/0006196 A1* | 1/2020 | Lin | H01L 23/5389 |
| 2022/0122936 A1* | 4/2022 | Williamson | H01L 24/73 |

* cited by examiner

SEMICONDUCTOR PACKAGES

BACKGROUND

The integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
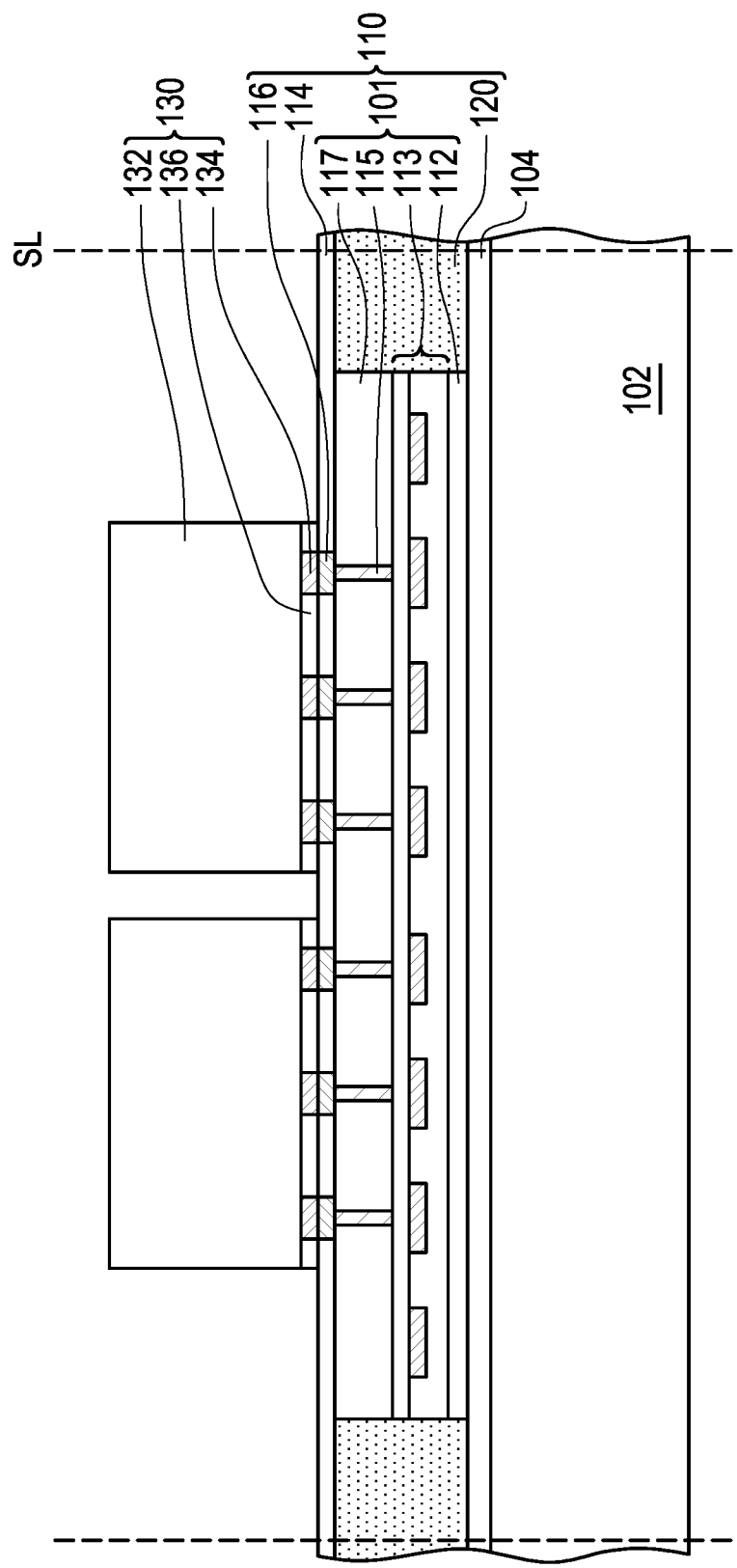
FIG. 1A to FIG. 1G illustrate schematic cross-sectional views of a method of forming a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good integrated circuits to increase the yield and decrease costs.

Figure 1B:
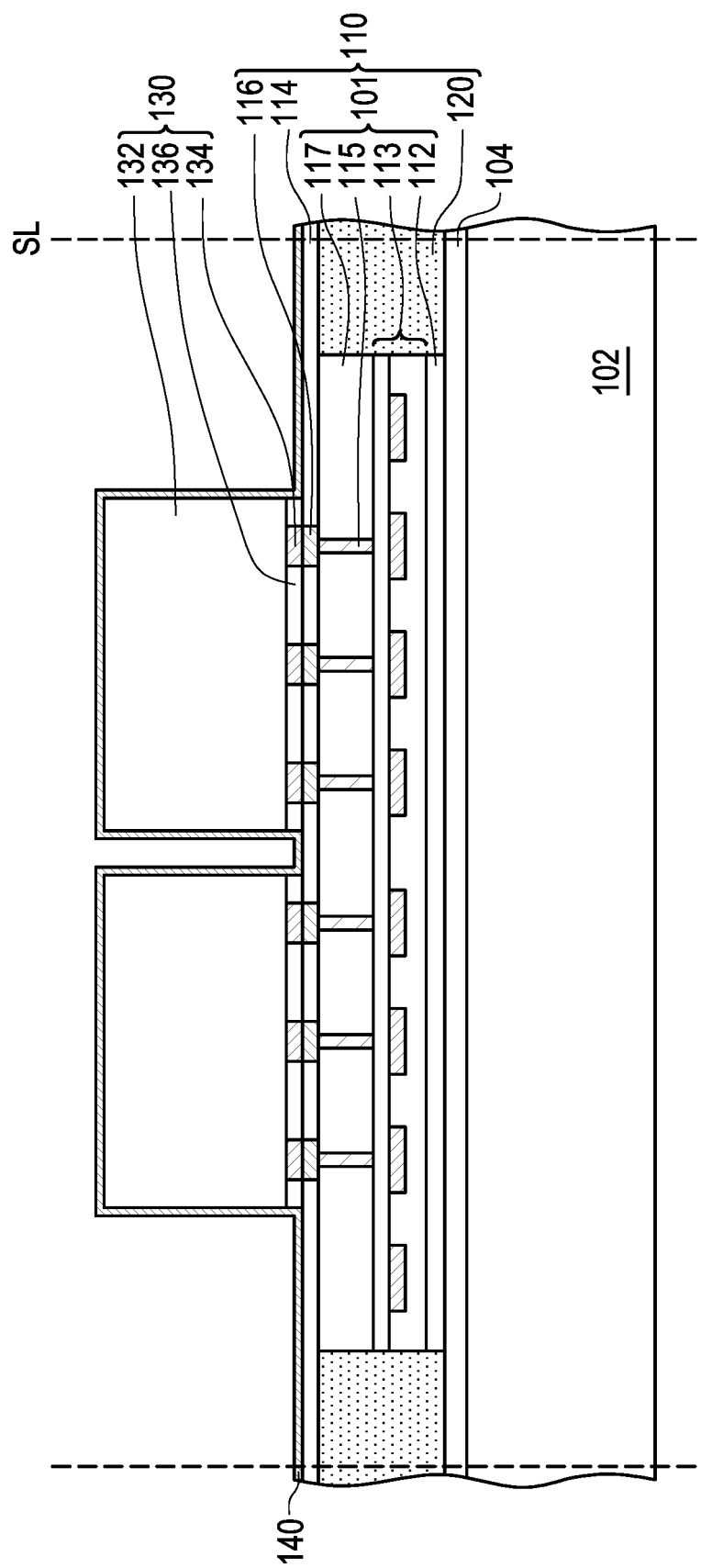
Figure 1C:
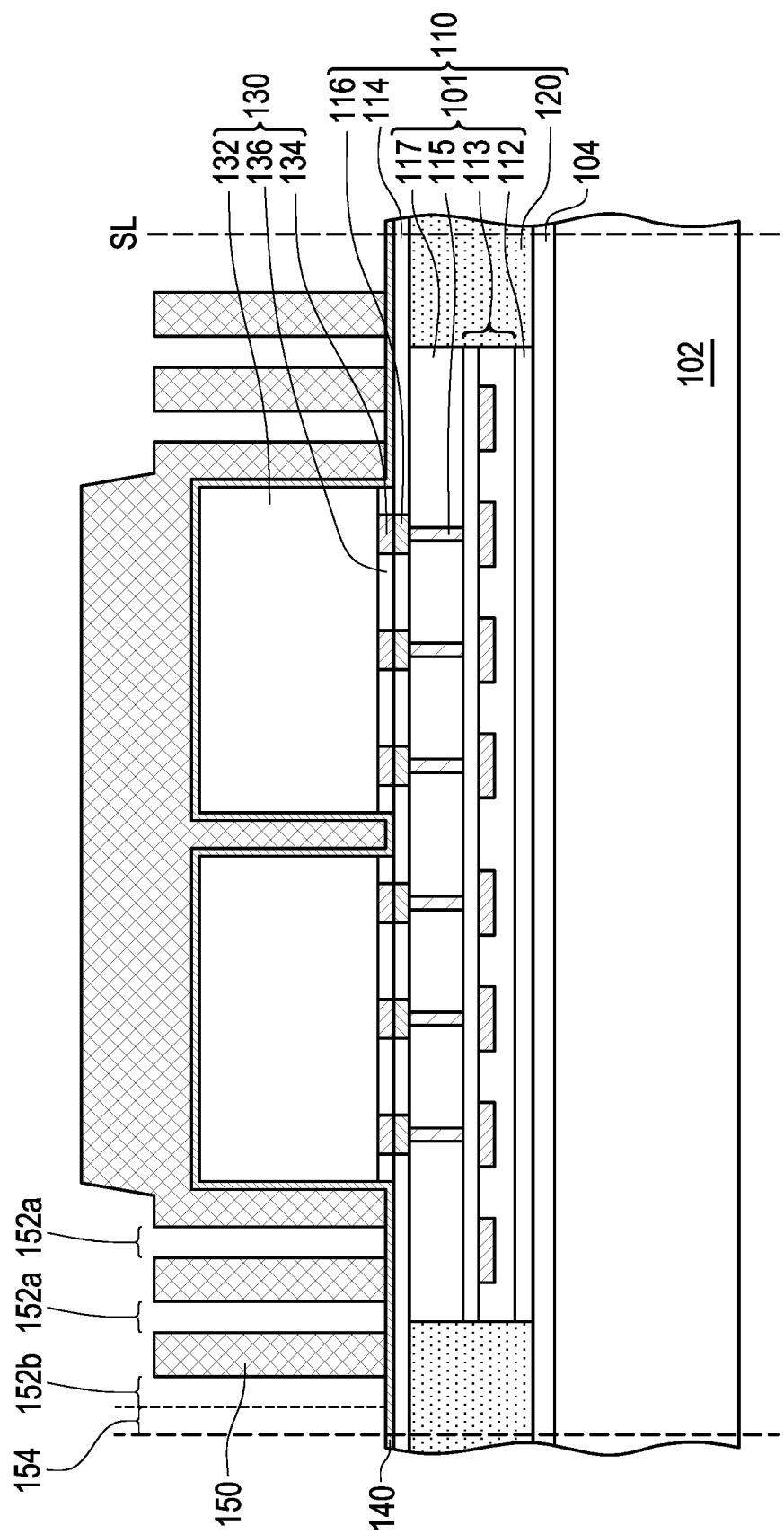
Figure 1D:
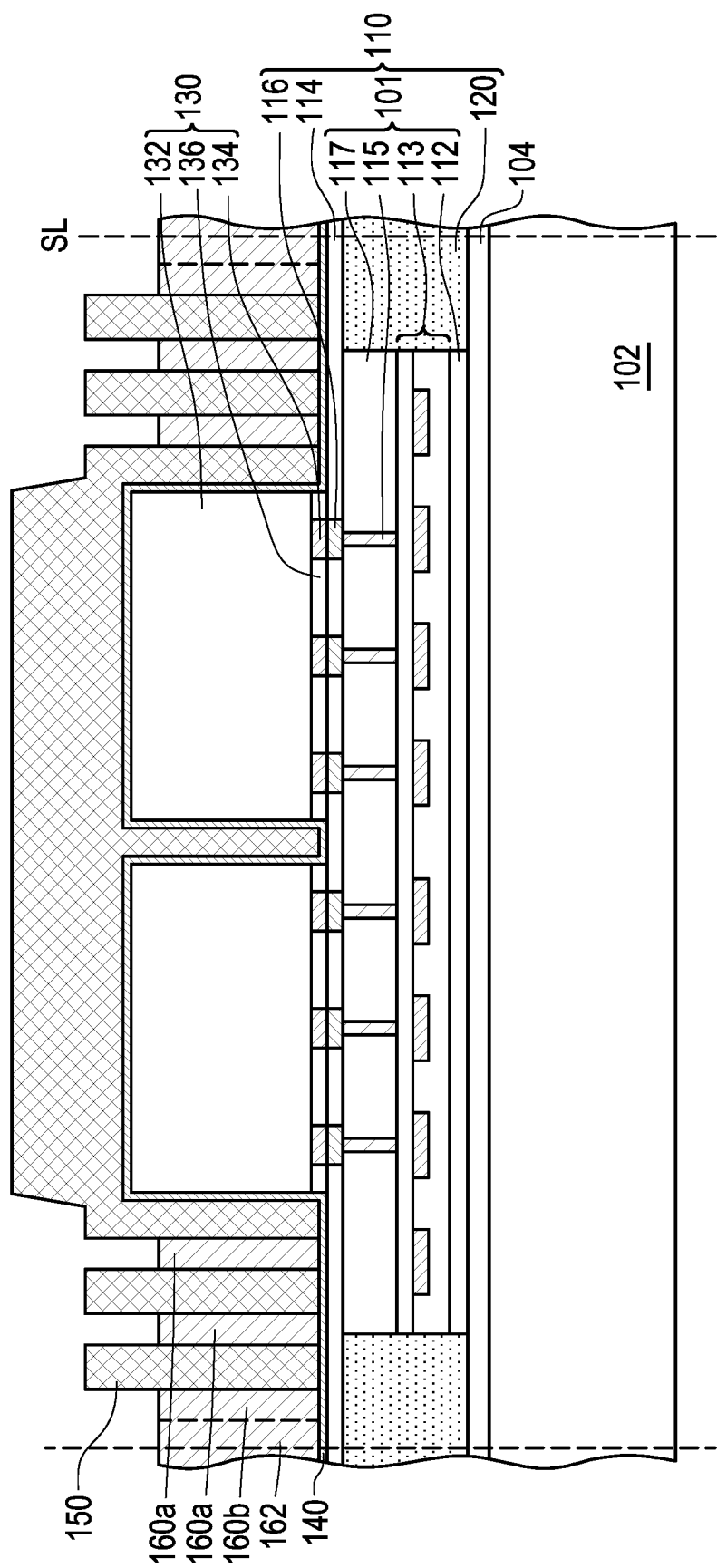
Figure 1E:
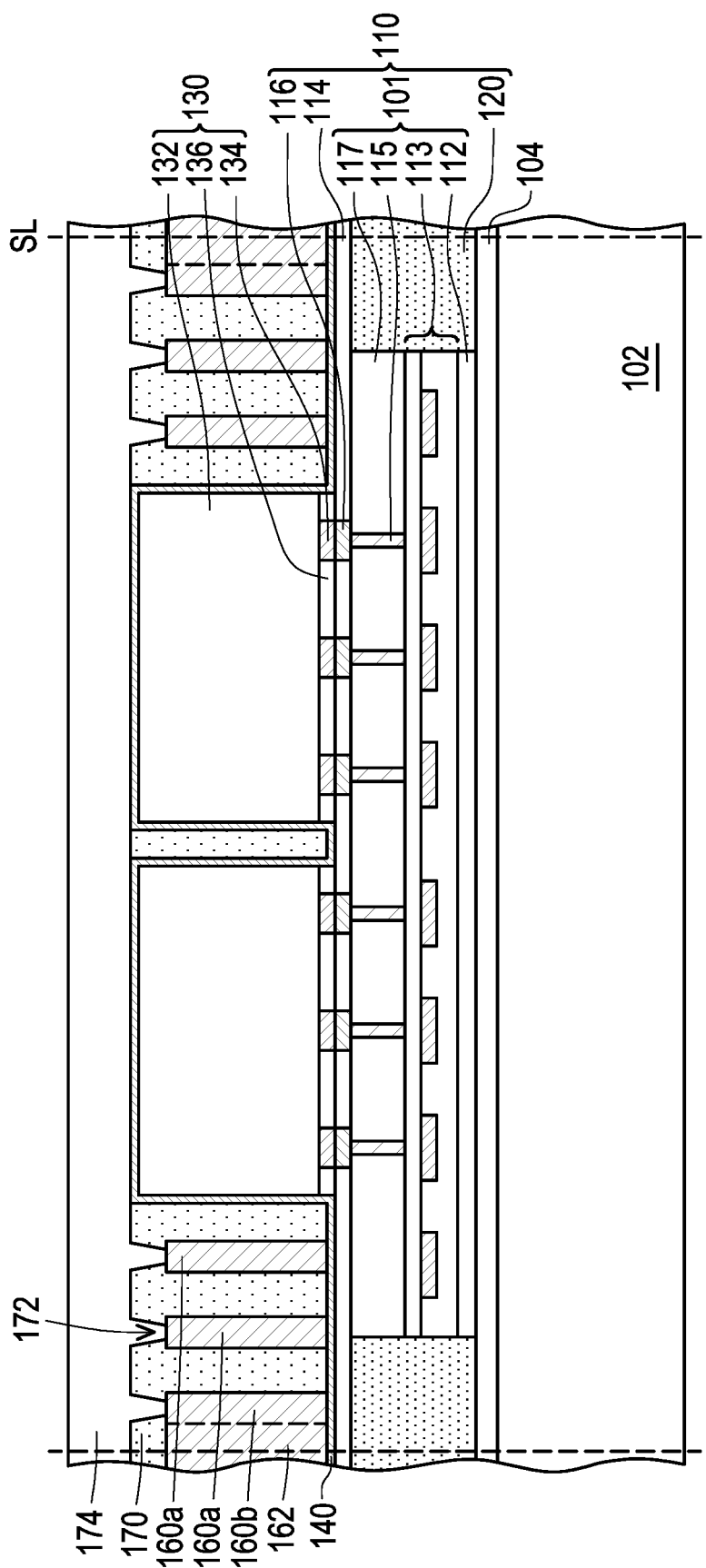

FIG. 1A to FIG. 1G illustrate schematic cross-sectional views of a method of forming a semiconductor package in accordance with some embodiments of the disclosure. FIG. 2A illustrates a schematic top view of openings for forming through vias and thermal conductive patterns of the semiconductor package in accordance with some embodiments of the disclosure, and FIG. 2B illustrates a schematic top view of the through vias and the thermal conductive patterns of the semiconductor package in accordance with some embodiments of the disclosure. FIG. 1C is a schematic cross-sectional view along line I-I' of FIG. 2A, and FIG. 1E is a schematic cross-sectional view along line I-I' of FIG. 2B, for example. It is understood that the disclosure is not limited by the method described below. Additional operations can be provided before, during, and/or after the method and some of the operations described below can be replaced or eliminated, for additional embodiments of the methods.

Although FIG. 1A to FIG. 1G are described in relation to a method, it is appreciated that the structures disclosed in FIG. 1A to FIG. 1G are not limited to such a method, but instead may stand alone as structures independent of the method.

Referring to FIG. 1A, a semiconductor structure 101 is provided on a carrier 102. In some embodiments, the carrier 102 is a supporting substrate. For example, the carrier 102 is a glass, a semiconductor wafer or a semiconductor block. The carrier 102 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. In some embodiments, the carrier 102 is un-doped and/or free of active devices. However, the disclosure is not limited thereto.

In some embodiments, an adhesive layer 104 is formed on the carrier 102, and then a semiconductor structure 101 is picked and placed on the adhesive layer 104 over the carrier 102 through the adhesive layer 104. The adhesive layer 104 may be a die attach film (DAF) or other suitable adhesive material. The adhesive layer 104 is formed on an entire surface of the carrier 102, for example. In other words, the adhesive layer 104 is continuously extended between the carrier 102 and the semiconductor structure 101. In such embodiments, a sidewall of the adhesive layer 104 is substantially flush with a sidewall of the carrier 102. However, the disclosure is not limited thereto. In alternative embodiments (not shown), a sidewall of the adhesive layer 104 is substantially flush with a sidewall of the semiconductor structure 101. In some embodiments, a debonding layer (not shown) is disposed between the adhesive layer 104 and the carrier 102, and the material of the debonding layer is suitable for bonding and debonding the carrier 102 from the above layers or die disposed thereon. In some embodiments, the debonding layer includes a light-to-heat conversion ("LTHC") layer, and such layer enables debonding from the carrier by applying laser irradiation. In some embodiments, a dielectric layer is further disposed between the debonding layer and the carrier 102 or replaces with the adhesive layer 104, and the dielectric layer is made of a dielectric material including silicon oxide, benzocyclobutene ("BCB"), polybenzooxazole ("PBO") or other suitable polymer-based dielectric material. In some embodiments, the carrier 102 has scribe lines SL to define a region for an integrated circuit 110 including the semiconductor structure 101. For example, the integrated circuit 110 is disposed between adjacent scribe lines SL. For clarity, only one integrated circuit 110 (e.g., also only one semiconductor structure 101) is illustrated. However, a plurality of integrated circuits 110 (e.g., also a plurality of semiconductor structures 101) may be respectively provided on regions of the carrier 102 defined by the scribe lines SL. In such embodiments, the integrated circuits 110 (e.g., also the semiconductor structures 101) are arranged side by side. For example, the integrated circuits 110 are arranged in a matrix.

In some embodiments, the semiconductor structure 101 includes a semiconductor substrate 112, an active device layer 113 on the semiconductor substrate 112 and a plurality of through vias 115 in a dielectric layer 117. The semiconductor substrate 112 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. The active device layer 113 may be partially in the semiconductor substrate 112 or in a dielectric layer on the semiconductor substrate 112. The active device layer 113 includes a dielectric layer and a plurality of active devices and a plurality of conductive patterns in the dielectric layer, for example. However, the disclosure is not limited thereto. In alternative embodiments, the active device layer 113 may have other configurations.

Then, an encapsulant 120 is formed over the carrier 102 to encapsulate the semiconductor structure 101. In some embodiments, the encapsulant 120 is formed by forming an insulating material to cover the semiconductor structure 101 and fill up gaps (e.g., gaps between the semiconductor structures 101), and then performing a planarization process on the insulating material until the semiconductor structure 101 and the insulating material are accessibly revealed. The insulating material may include a dielectric material such as silicon oxide, TEOS silicon oxide, or other suitable gap-filling materials formed by a deposition process such as CVD, PECVD, or other suitable method. Formation of the insulating material may further include a gap-filling process, a curing process and/or a hardening process. The planarization process may include a grinding process, a chemical mechanical polishing (CMP) process, or other suitable removing process. In some embodiments, a surface (e.g., top surface) of the encapsulant 120 is substantially coplanar with a surface (e.g., top surface) of the semiconductor structure 101.

Then, a bonding layer 114 and a plurality of bonding pads 116 in the bonding layer 114 are formed over the encapsulant 120 and the semiconductor structure 101, for example. In some embodiments, the bonding layer 114 includes organic materials such as polybenzoxazole (PBO) and polyimide (PI) or inorganic materials such as silicon oxide or silicon nitride. The bonding layer 114 may be a single layer or a multiple layer structure. The bonding pads 116 may be vias, pads, pillars or other suitable connectors. In some embodiments, the bonding pads 116 are electrically connected to the through vias 115. A material of the bonding pads 116 includes copper (Cu), aluminum (Al), aluminum copper alloy (AlCu), gold, titanium, cobalt, an alloy, or other suitable conductive material, for example. Then, the integrated circuit 110 is formed. In some embodiments, the integrated circuit 110 is a wafer or a die. For example, the integrated circuit 110 is a logic die or a system-on-chip (SoC).

After that, a plurality of integrated circuits 130 are bonded to the integrated circuit 110 over the carrier 102. The integrated circuit 130 may be different from the integrated circuit 110 in size and/or type. For example, the integrated circuit 130 is smaller than the integrated circuit 110, and multiple integrated circuits 130 are arranged over the same integrated circuit 110. The integrated circuits 130 may be arranged in a matrix. The integrated circuit 130 may include a die. The integrated circuit 130 is a single die, a chiplet or a die stack, for example. In some embodiments, the integrated circuit 110 is a logic die, and the integrated circuit 130 is a memory die. For example, the integrated circuit 130 is a DRAM die, a SRAM die, a flash integrated circuit, a high bandwidth memory (HBM) die, an application-specific integrated circuit (ASIC) die, a central processing unit (CPU) die, a graphic processing unit (GPU) die, a micro control unit (MCU) die, a Transceiver (TRX) die, an input-output (I/O) die, a baseband (BB) die or an application processor (AP) die. However, the disclosure is not limited thereto. The integrated circuit 110 and the integrated circuits 130 have the same size and/or type according to the requirements.

The integrated circuit 130 may include a semiconductor substrate 132, a bonding layer 134 on the semiconductor substrate 132 and a plurality of bonding pads 136 in the bonding layer 134. The semiconductor substrate 132 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. In some embodiments, the bonding layer 134 includes organic materials such as polybenzoxazole (PBO) and polyimide (PI) or inorganic materials. The bonding pads 136 may be vias, pads, pillars or other suitable connectors. A material of the bonding pads 136 includes copper (Cu), aluminum (Al), aluminum copper alloy (AlCu), gold, titanium, cobalt, an alloy, or other suitable conductive material, for example. In some embodiments, a thickness of the integrated circuit 130 (e.g., about a thickness of the semiconductor substrate 132) is in a range of 80 μm to 160 μm. A spacing between the integrated circuits 130 (i.e., die to die distance) is in a range of 60 μm to 100 μm, and a distance between the integrated circuit 130 and the scribe line SL of the carrier 102 is in a range of 3 mm to 5 mm.

In some embodiments, the bonding pads 136 of the integrated circuit 130 are bonded to the bonding pads 116 of the integrated circuit 110, and the bonding layer 134 of the integrated circuit 130 is bonded to the bonding layer 114 of the integrated circuit 110. Thus, the integrated circuits 130 are electrically connected to the integrated circuit 110 respectively.

Referring to FIG. 1B, a seed layer 140 is formed on the integrated circuits 130 over the integrated circuit 110. In some embodiments, the seed layer 140 is continuously formed on exposed surfaces of the encapsulant 120, the integrated circuit 110 and the integrated circuits 130. For example, the seed layer 140 is continuously formed on a top surface of the encapsulant 120, a top surface of the integrated circuit 110, and sidewalls and top surfaces of the integrated circuit 110. In some embodiments, the seed layer 140 includes titanium (Ti)/copper (Cu) or other suitable conductive material, and the seed layer 140 is formed by electrochemical plating (ECP), electroplating, electroless plating or other suitable process. In alternative embodiments, the seed layer 140 is also referred to as a barrier layer.

Referring to FIG. 1C, a resist layer 150 is formed over the carrier 102 to cover the integrated circuits 130, and the resist layer 150 has a plurality of openings 152a, 152b and 154 therein. The resist layer 150 is a dry film resist (DFR) layer, for example. In some embodiments, the openings 152a, 152b and 154 expose portions of the seed layer 140 on the encapsulant 120. In some embodiments, the resist layer 150 is formed on the seed layer 140 to fully cover the integrated circuits 130. The resist layer 150 may be conformally formed on the encapsulant 120 and the integrated circuits 130. Thus, as shown in FIG. 1C, a surface (e.g., top surface) of the resist layer 150 over the integrated circuits 130 may be higher than a surface (e.g., top surface) of the resist layer 150 over the integrated circuit 110 and the encapsulant 120. In some embodiments, the resist layer 150 has a first portion and a second portion on the first portion, and the first portion is rectangular and the second portion is trapezoid.

In some embodiments, as shown in FIG. 2A, the openings 152a, 152b and 154 are formed to surround the integrated circuits 130, respectively. For example, the openings 152a, 152b and 154 are formed along one ring-shaped path surrounding the integrated circuits 130, respectively. In some embodiments, the opening 152a is separated from the opening 152b and disposed between the integrated circuits 130 and the opening 152b. The opening 154 is connected to the opening 152b, in other words, the opening 154 is integrally formed with the opening 152b, for example. In some embodiments, as shown in FIG. 2A, from a top view, a shape of the opening 152b is substantially the same as the opening 152a, and a shape of the opening 154 is different from the opening 152a, 152b. For example, the opening 152a and the opening 152b are circular, and the opening 154 is line-shaped (e.g., fin-shaped). In such embodiments, the openings 152a and the openings 152b are formed by using the same photomask, and the openings 154 are formed by using another photomask. However, the disclosure is not limited thereto. The openings 152a, 152b and 154 may be formed by using the same photomask. A diameter (e.g., width and/or length) of the opening 154 may be substantially the same as, smaller than or larger than the opening 152a, 152b. In some embodiments, a width of the opening 154 is smaller than the opening 152a, 152b, and a length of the opening 154 is larger than the opening 152a, 152b. In alternative embodiments, the opening 152b and the opening 154 are collectively referred to as an elongated opening, and the opening 152b and the opening 154 are respectively a via-shaped portion and a fin-shaped portion of the elongated opening.

Referring to FIG. 1D, a plurality of through vias 160a, 160b are formed in the openings 152a and 152b, and a plurality of thermal conductive patterns 162 are formed in the openings 154. In some embodiments, the through vias 160a, 160b and the thermal conductive patterns 162 are formed to have a height smaller than a height of the resist layer 150. In some embodiments, the height of the through vias 160a, 160b and the thermal conductive patterns 162 is also smaller than the height of the integrated circuits 130. In such embodiments, surfaces (e.g., top surfaces) of the through vias 160a, 160b and the thermal conductive patterns 162 are lower than surfaces (e.g., top surfaces) of the resist layer 150 and the integrated circuits 130. The through vias 160a, 160b and the thermal conductive patterns 162 may have substantially the same height, and thus the surfaces (e.g., top surfaces) of the through vias 160a, 160b and the thermal conductive patterns 162 are substantially coplanar. The height of the through vias 160a, 160b and the thermal conductive patterns 162 is in a range of 50 μm to 300 μm, for example, depending on the height of the integrated circuits 130. In some embodiments, the through vias 160a, 160b and the thermal conductive patterns 162 are formed by forming a conductive material in the openings 152a, 152b and 154 without filling up the openings 152a, 152b and 154. The conductive material may include copper (Cu), aluminum (Al), aluminum copper alloy (AlCu), gold, titanium, cobalt, an alloy, or other suitable conductive material. The conductive material may be formed by electrochemical plating (ECP), electroplating, electroless plating or other suitable process.

Referring to FIG. 1E, the resist layer 150 is removed. The resist layer 150 may be removed by a stripping process. In some embodiments, the through vias 160a, 160b and the thermal conductive patterns 162 are formed on the seed layer 140 directly. In some embodiments, the through vias 160a, 160b and the thermal conductive patterns 162 are not physically connected to the integrated circuits 110, 130. However, the disclosure is not limited thereto. In alternative embodiments, at least one of the through vias 160a, 160b and the thermal conductive pattern 162 is physically connected to one of the integrated circuits 110, 130. For example, at least one of the through vias 160a, 160b and the thermal conductive pattern 162 is physically connected to the integrated circuit 110, 130 through the bonding pad 116, 136.

In some embodiments, as shown in FIG. 2B, the through vias 160a, 160b and the thermal conductive patterns 162 are formed to surround the integrated circuits 130, respectively. For example, the through vias 160a, 160b and the thermal conductive patterns 162 are formed along one ring-shaped path surrounding the integrated circuits 130, respectively. In some embodiments, the through vias 160a are arranged along two ring-shaped paths surrounding the integrated circuits 130. However, the disclosure is not limited thereto. In alternative embodiments, the through vias 160a are arranged along one or more than two ring-shaped paths surrounding the integrated circuits 130.

In some embodiments, the through via 160a is separated from the through via 160b and disposed between the integrated circuits 130 and the through via 160b. In some embodiments, the thermal conductive pattern 162 is physically connected to the through via 160b, in other words, the thermal conductive pattern 162 is integrally formed with the through via 160b. Thus, no interface exists between the thermal conductive pattern 162 and the through via 160b, for example. As shown in FIG. 2B, from a top view, a shape of the through via 160b is substantially the same as the through via 160a, and a shape of the thermal conductive pattern 162 is different from the through via 160a, 160b. For example, the through via 160a, 160b are circular, and the thermal conductive pattern 162 is line-shaped (e.g., fin-shaped). However, the disclosure is not limited thereto. In alternative embodiments, the thermal conductive pattern 162 may have other suitable shapes. A diameter (e.g., width and/or length) of the thermal conductive pattern 162 may be substantially the same as, smaller than or larger than that of the through via 160a, 160b. For example, the width of the thermal conductive pattern 162 is smaller than the through via 160a, 160b. The width of the through via 160a, 160b and the thermal conductive patterns 162 may be in a range of 10 μm to 500 μm. The length of the thermal conductive pattern 162 may be larger than the through via 160a, 160b. The length of the thermal conductive pattern 162 may be in a range of 10 μm to 500 μm. In an embodiment in which the thermal conductive pattern 162 may have a width substantially the same as the through via 160b, the through via 160b is integrally formed with the thermal conductive pattern 162 as a wall structure having a constant width. In some embodiments, the thermal conductive pattern 162 is physically connected to the through via 160b and extends from a sidewall of the through via 160b toward a sidewall of the encapsulant 120. For example, the thermal conductive pattern 162 extends on the integrated circuit 110 and the encapsulant 120 from the through via 160b to the scribe line SL of the carrier 102. In some embodiments, the thermal conductive pattern 162 extends beyond the scribe line SL of the carrier 102. In alternative embodiments, a sidewall of the thermal conductive pattern 162 is substantially flush with the scribe line SL of the carrier 102. The through via 160b and the thermal conductive pattern 162 may be collectively referred to as a dummy through via, and the through via 160b and the thermal conductive pattern 162 are, for example, respectively a via-shaped portion and an extension portion (e.g., fin-shaped portion) of the dummy through via.

In some embodiments, as shown in FIG. 2B, the thermal conductive patterns 162 at the same side of the integrated circuit 110 are substantially parallel to one another. The thermal conductive patterns 162 may be arranged regularly, that is, a spacing between the adjacent thermal conductive patterns 162 is constant. In alternative embodiments, the thermal conductive patterns 162 at the same side of the integrated circuit 110 may be arranged irregularly or randomly, that is, a spacing between the adjacent thermal conductive patterns 162 is not constant. Similarly, the through vias 160a may be arranged regularly, irregularly or randomly. In some embodiments, the through vias 160a are also referred to as internal through vias, and the through vias 160b are also referred to as external through vias.

After removing the resist layer 150, an encapsulant 170 is formed to encapsulate the integrated circuits 130 and the through vias 160a. In some embodiments, the encapsulant 170 is formed by forming an insulating material to cover the integrated circuits 130 and fill up gaps among the integrated circuits 130, the through vias 160a and the through via 160b, and then performing a planarization process on the insulating material until the integrated circuits 130 and the insulating material are accessibly revealed. The insulating material may include a dielectric material such as silicon oxide, TEOS silicon oxide, or other suitable gap-filling materials formed by a deposition process such as CVD, PECVD, or other suitable method. Formation of the insulating material may further include a gap-filling process, a curing process and/or a hardening process. The planarization process may include a grinding process, a chemical mechanical polishing (CMP) process, or other suitable removing process. In some embodiments, after forming the encapsulant 170, a surface (e.g., top surface) of the encapsulant 170 is substantially coplanar with surfaces (e.g., top surfaces) of the integrated circuits 130. For example, the surface (e.g., top surface) of the encapsulant 170 is substantially coplanar with a surface (e.g., top surfaces) of the seed layer 140 on the integrated circuits 130. In some embodiments, the seed layer 140 on the integrated circuits 130 may be partially or entirely removed during the planarization process. In other words, after the planarization process, the seed layer 140 may be formed on the sidewalls of the integrated circuits 130 without covering surfaces (e.g., top surfaces) of the integrated circuits 130. The surface (e.g., top surface) of the encapsulant 170 may be substantially coplanar with surfaces (e.g., top surfaces) of the seed layer 140 and the integrated circuits 130.

In some embodiments, since the surfaces (e.g., top surfaces) of the through vias 160a, the through via 160b and the thermal conductive pattern 162 are lower than the surface (e.g., top surfaces) of the integrated circuits 130, during the planarization process, the through vias 160a, the through via 160b and the thermal conductive pattern 162 would not be planarized. Accordingly, contaminant (e.g., copper residue) generated by performing the planarization process on materials (e.g., copper) of the through vias 160a, the through via 160b and the thermal conductive pattern 162 in another embodiment may be prevented. In some embodiments, after planarization, portions of the insulating material are removed to form recesses 172, and the recesses 172 expose portions of through vias 160a and portions of the through via 160b and the thermal conductive pattern 162. For example, the through vias 160a and the through via 160b are exposed by the recesses 172. The recess 172 may have a depth in a range of 2 μm to 5 μm. In alternative embodiments, at least one of the recesses 172 is omitted. For example, the encapsulant 170 is formed without the recesses 172.

Then, a passivation layer 174 may be formed on the encapsulant 170, to protect the integrated circuits 130. In some embodiments, the passivation layer 174 includes organic materials such as polybenzoxazole (PBO) and polyimide (PI) or inorganic materials. In some embodiments, the recesses 172 are filled up by the passivation layer 174. However, the disclosure is not limited thereto. In alternative embodiments, the recesses 172 may be partially or entirely retained. In addition, the passivation layer 174 may be omitted.

Figure 1F:
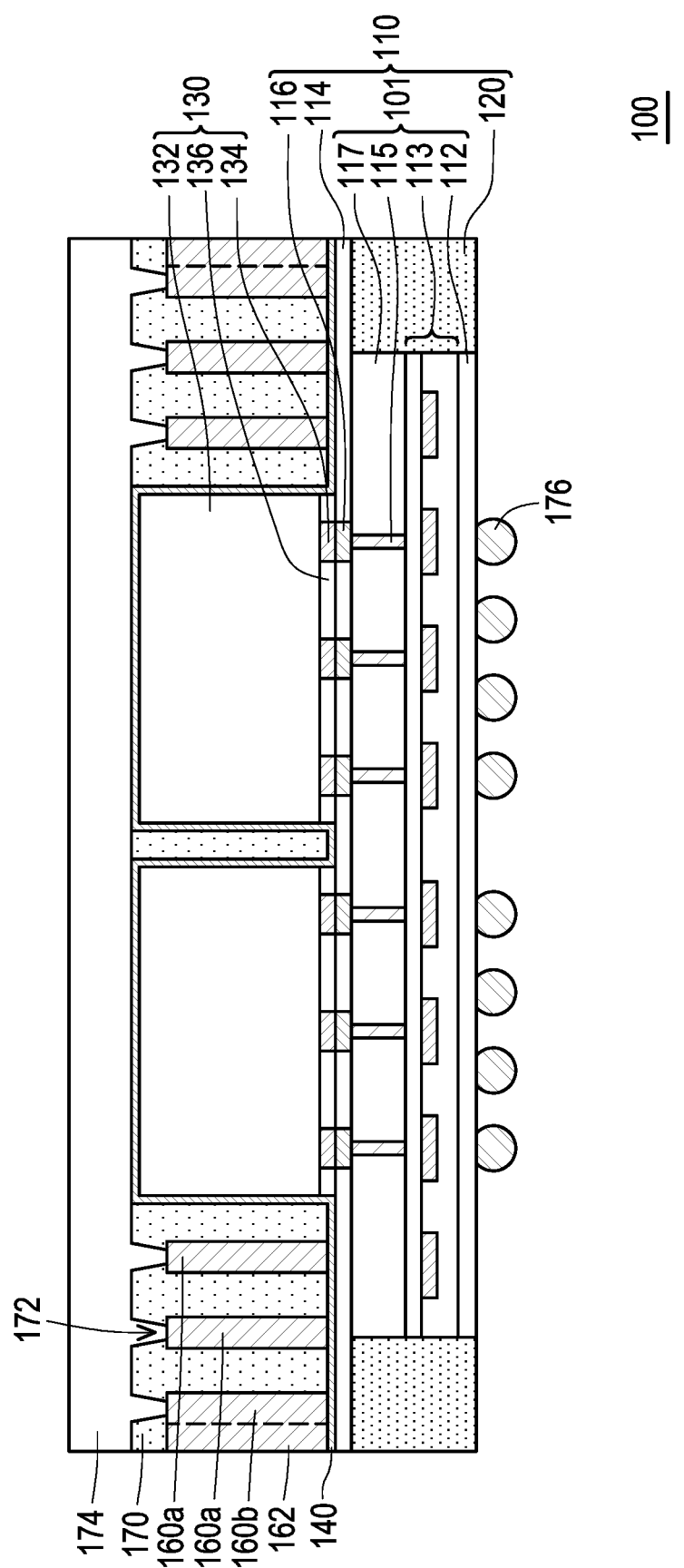
Figure 2A:
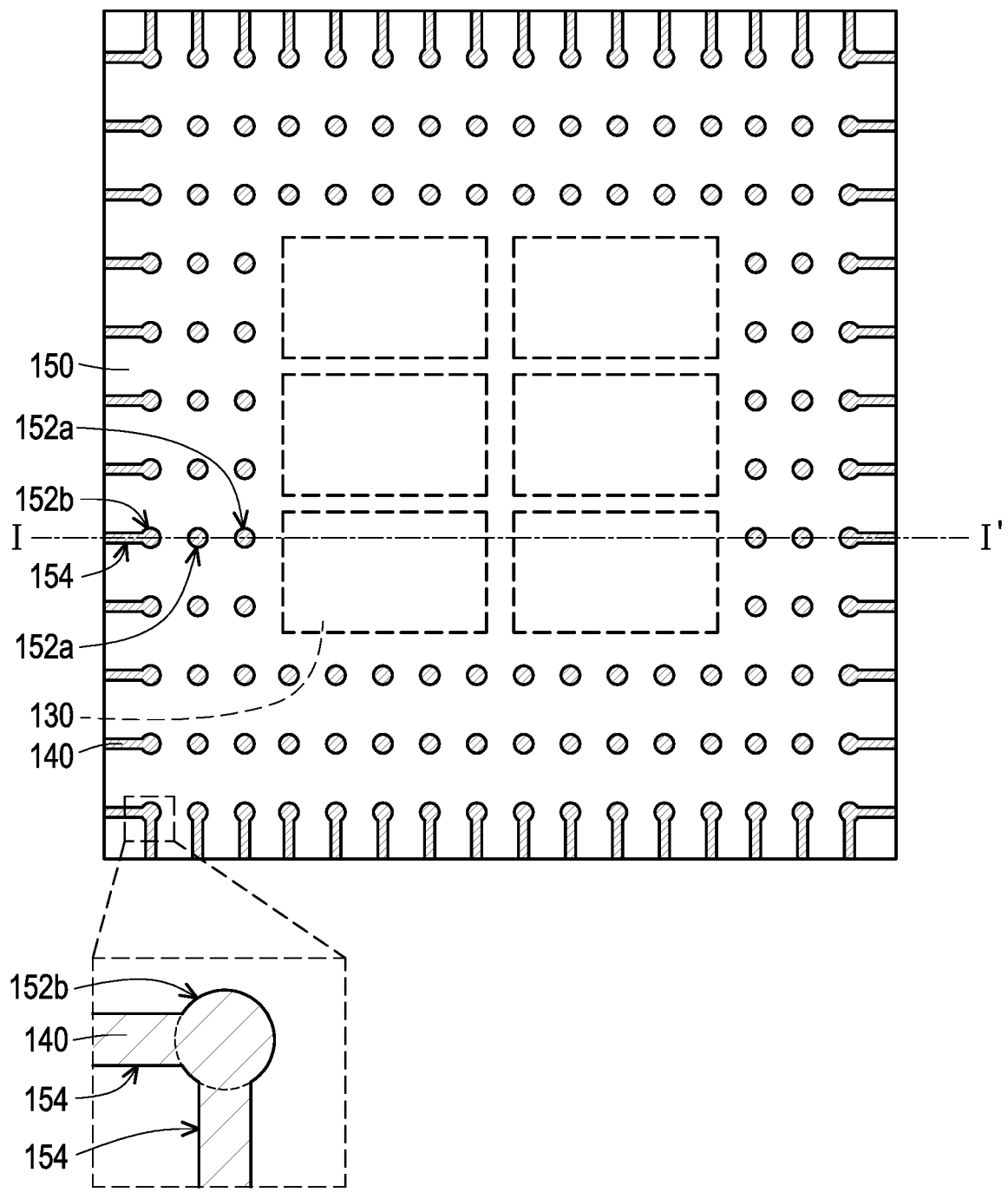
FIG. 2A illustrates a schematic top view of openings for forming through vias and thermal conductive patterns of the semiconductor package in accordance with some embodiments of the disclosure.
Figure 2B:
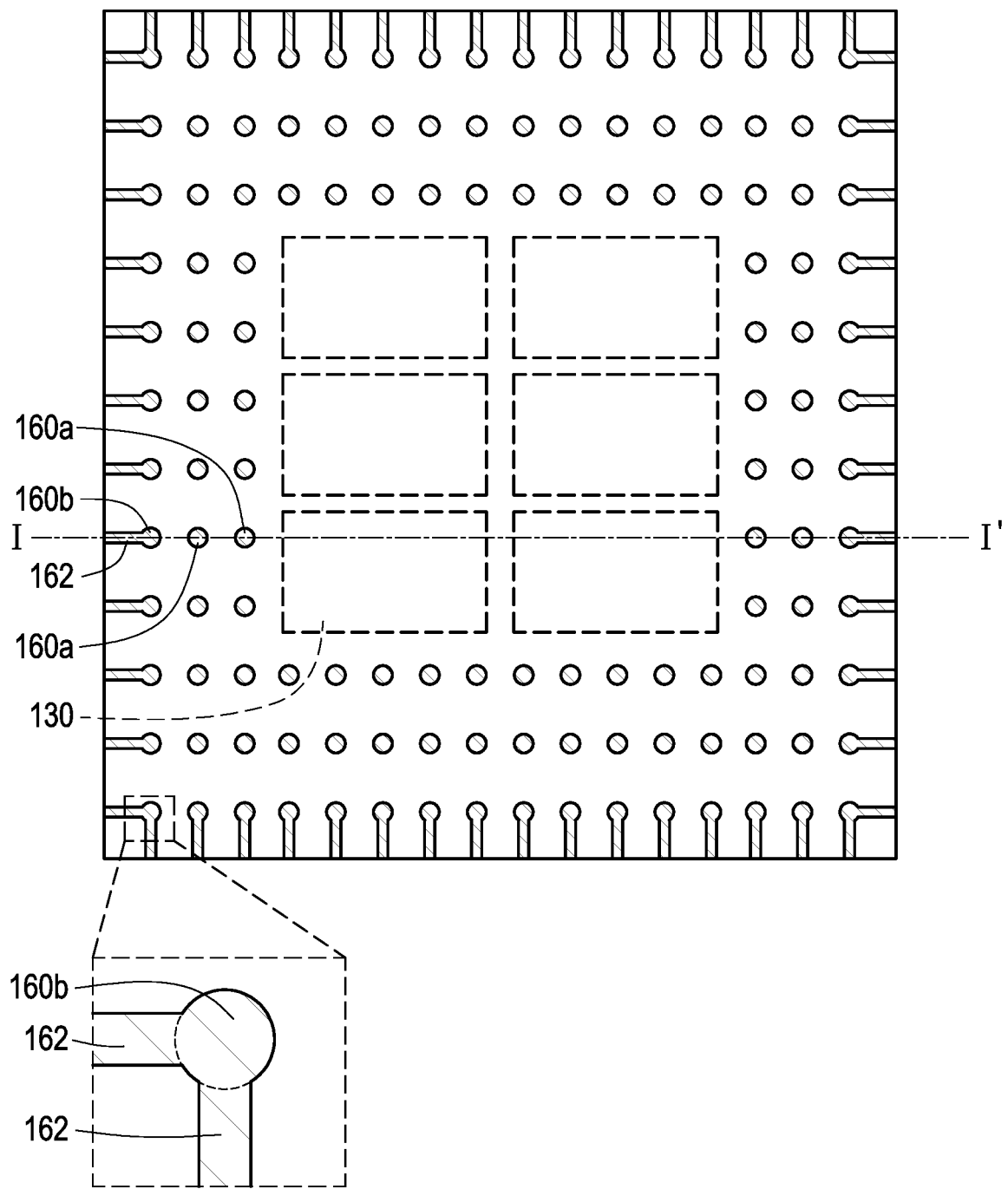
FIG. 2B illustrates a schematic top view of the through vias and the thermal conductive patterns of the semiconductor package in accordance with some embodiments of the disclosure.

Referring to FIG. 1F, a dicing (cutting) process is performed, so as to form a semiconductor package 100. In some embodiments, the dicing process is performed on the passivation layer 174, the encapsulant 170 and the encapsulant 130 along the scribe lines SL. In some embodiments, since the thermal conductive pattern 162 extend beyond the scribe line SL, the dicing process is further performed on thermal conductive patterns 162. The dicing process may be a mechanical blade sawing or a laser cutting. In some embodiments, after dicing, the sidewalls of the thermal conductive patterns 162 are exposed and substantially flush with the sidewalls of the encapsulants 120, 170 and the passivation layer 174. Then, a plurality of conductive terminals 176 are formed to electrically connect to the integrated circuit 110. For example, the conductive terminals 176 are electrically connected to the integrated circuit 110 by through substrate vias (not shown) in the semiconductor substrate 112. However, the disclosure is not limited thereto. The semiconductor package 100 may have other suitable configurations. For example, the semiconductor package 100 is formed without the conductive terminals 176, and the semiconductor package 100 is then attached to a carrier substrate with a heat spreader thereover. In some embodiments, the formed semiconductor package 100 is a system-on-integrated-chips (SoIC) package, and the semiconductor package 100 integrates the integrated circuits 110, 130 and the thermal conductive patterns such as the through vias 160a, 160b and the thermal conductive patterns 162. However, the disclosure is not limited thereto. The semiconductor package 100 may have other suitable configurations.

Figure 1G:
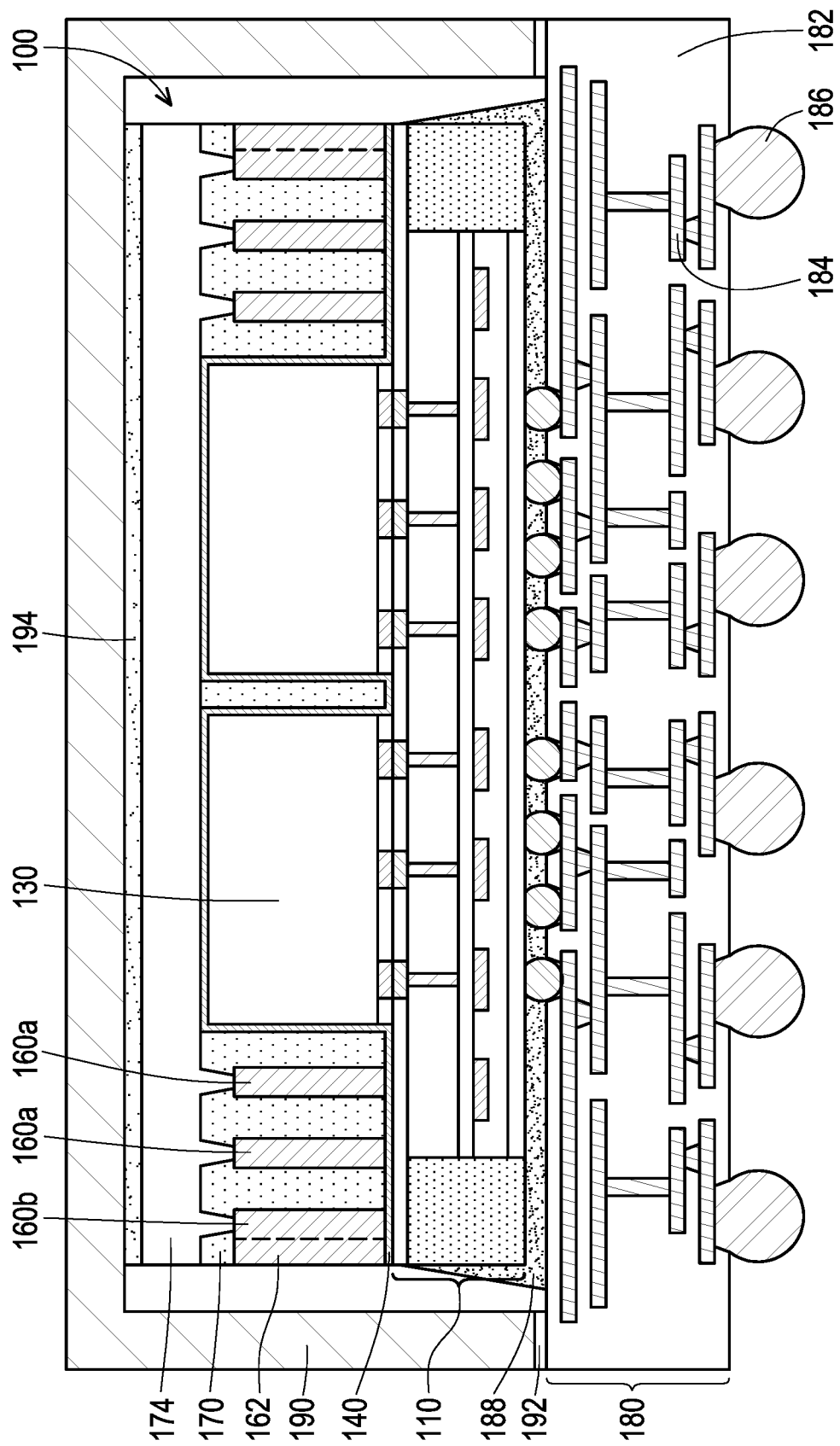

Referring to FIG. 1G, in some embodiments, the semiconductor package 100 is further mounted on a package substrate 180, and a heat spreader 190 is formed to cover the semiconductor package 100. The package substrate 180 may include a package. The package substrate 180 may be an electrical device, a printed circuit board (PCB), an interposer or other suitable redistribution line structure. In some embodiments, the package substrate 180 includes a dielectric layer 182, a plurality of conductive patterns 184 in the dielectric layer 182 and a plurality of conductive terminals 186 disposed at a side of the dielectric layer 182 and electrically connected to the conductive patterns 184. In some embodiments, the semiconductor package 100 is bonded to the package substrate 180 through the conductive terminals 176, and an underfill 188 is formed between the semiconductor package 100 and the package substrate 180 to encapsulate the conductive terminals 176. In some embodiments, the underfill 188 is further disposed on the sidewall of the encapsulant 120 and exposes the sidewalls of the thermal conductive patterns 162. In alternative embodiments, the underfill 188 covers a portion of the sidewalls of the thermal conductive patterns 162.

In some embodiments, the heat spreader 190 is adhered to the package substrate 180 through an adhesive layer 192. The adhesive layer 192 may be a conductive paste such as a silver paste or an adhesive such as DAF. In some embodiments, a thermal interface material (TIM) 194 is further formed between the heat spreader 190 and the semiconductor package 100. In some embodiments, the heat spreader 190 includes a lid, a heat sink, a water cooling device, or a combination thereof. The heat spreader 190 may surround the sidewall of the semiconductor package 100 and covers the top of the semiconductor package 100. For example, the heat spreader 190 is immediately adjacent to the exposed sidewalls of the thermal conductive patterns 162, and thus the heat generated by the semiconductor package 100 may be conducted to the heat spreader 190 through the thermal conductive patterns 162. In alternative embodiments, the heat spreader 190 is in physical contact with the exposed sidewalls of the thermal conductive patterns 162. In some embodiments, the TIM 194 is disposed between and in physical contact with the passivation layer 174 and the heat spreader 190. Accordingly, the heat spreader 190 may be thermally coupled to the semiconductor package 100 at least through the thermal conductive patterns 162 and the TIM 194, and thus the heat generated from the integrated circuits 110, 130 may be dissipated efficiently. The heat spreader 190 may have other configurations. For example, the heat spreader 190 includes a first lid covering the sidewall and the top of the semiconductor package 100, a second lid on the first lid and a heat sink on the second lid. In addition, the TIM 194 may be omitted. In such embodiments, the heat spreader 190 is in direct contact with the passivation layer 174, the encapsulant 170, the seed layer 140 or the integrated circuit 130.

In some embodiments, the through vias 160a (e.g., internal through vias) and the through vias 160b (e.g., external through vias) are arranged to surround the integrated circuits 130, so as to thermally couple to the integrated circuits 110, 130. In addition, the thermal conductive patterns 162 may be formed to physically connect to the through vias 160b and have a larger size than the through vias 160b, and thus the heat generated by the integrated circuits 110, 130 may be conducted through the thermal conductive patterns 162. Thus, the heat generated by the semiconductor package 100 may be dissipated efficiently.

Figure 3:
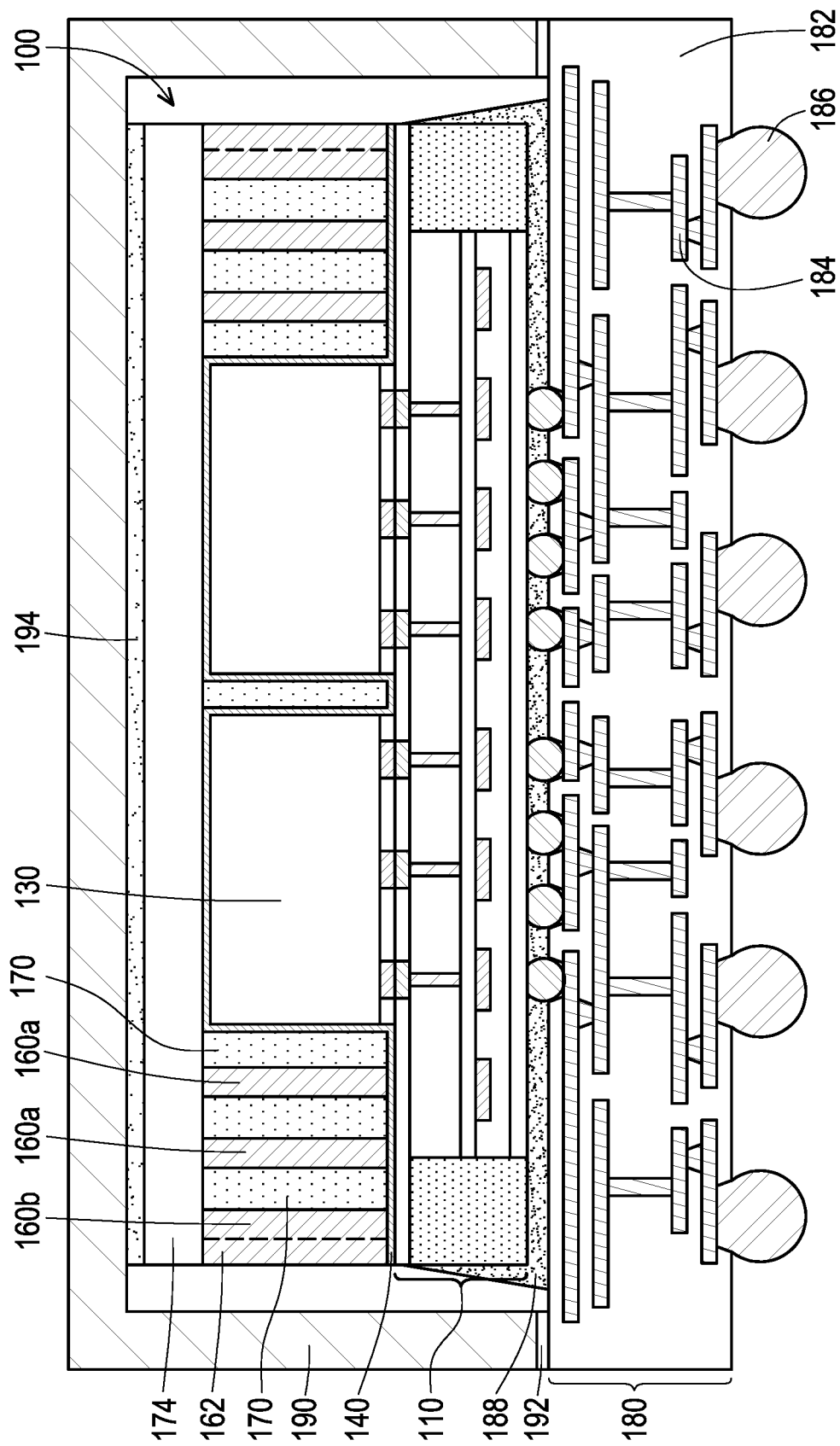
FIG. 3 illustrates a schematic cross-sectional view of a semiconductor package in accordance with some embodiments of the disclosure.

In some embodiments, the through via 160a, the through via 160b and the thermal conductive pattern 162 have a height smaller than the integrated circuits 130. However, the disclosure is not limited thereto. In alternative embodiments, as shown in FIG. 3, the through via 160a, the through via 160b and the thermal conductive pattern 162 have a height substantially equal to the encapsulant 170. In such embodiments, the surfaces (e.g., top surfaces) of the through via 160a, the through via 160b and the thermal conductive pattern 162 are substantially coplanar with the surfaces (e.g., top surfaces) of the encapsulant 170 and the integrated circuits 130. For example, the surfaces (e.g., top surfaces) of the through via 160a, the through via 160b and the thermal conductive pattern 162 are substantially coplanar with the surfaces (e.g., top surfaces) of the encapsulant 170 and the seed layer 140.

Figure 4A:
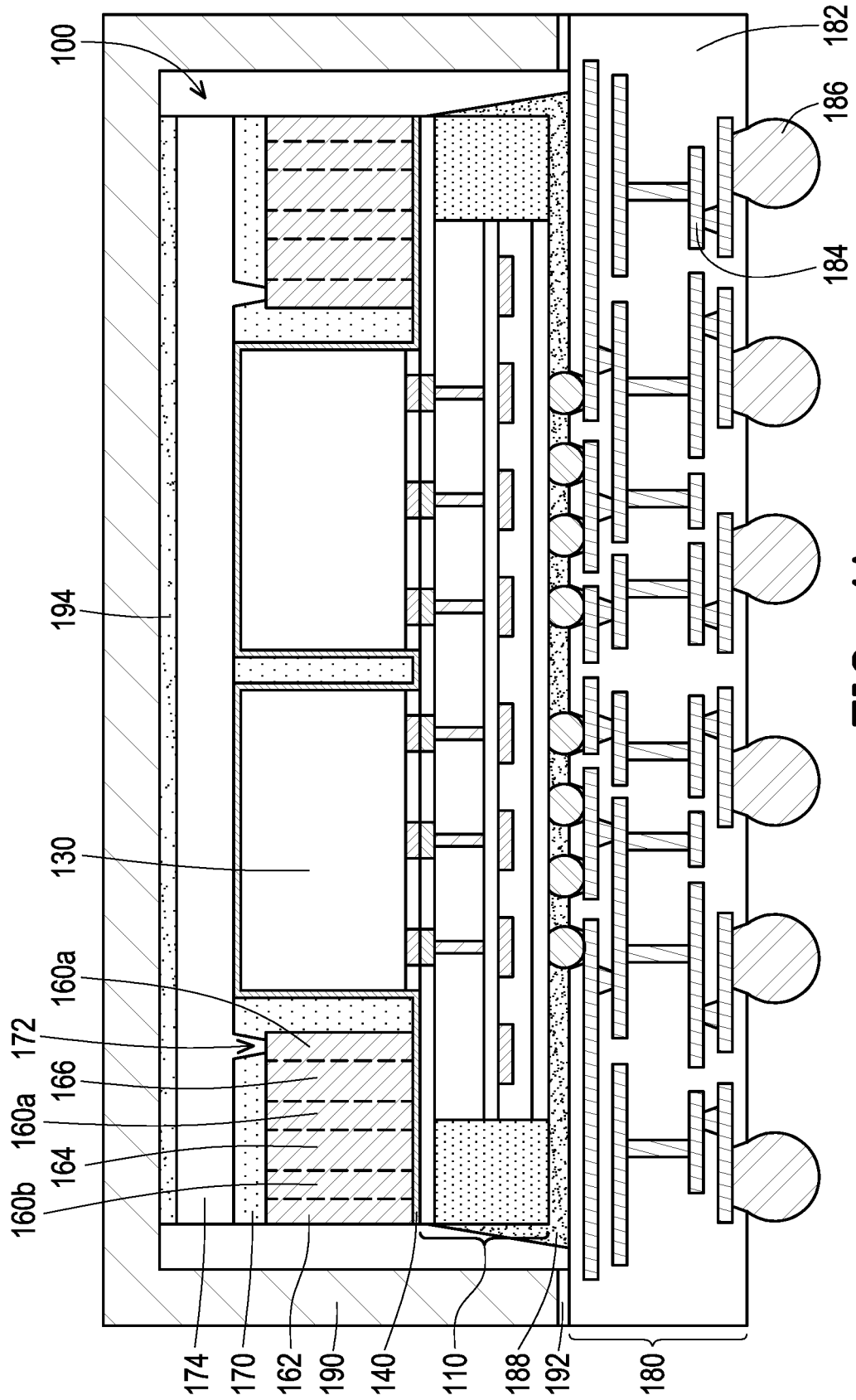
FIG. 4A and FIG. 4B respectively illustrate a schematic cross-sectional view and a schematic top view of a semiconductor package in accordance with some embodiments.
Figure 4B:
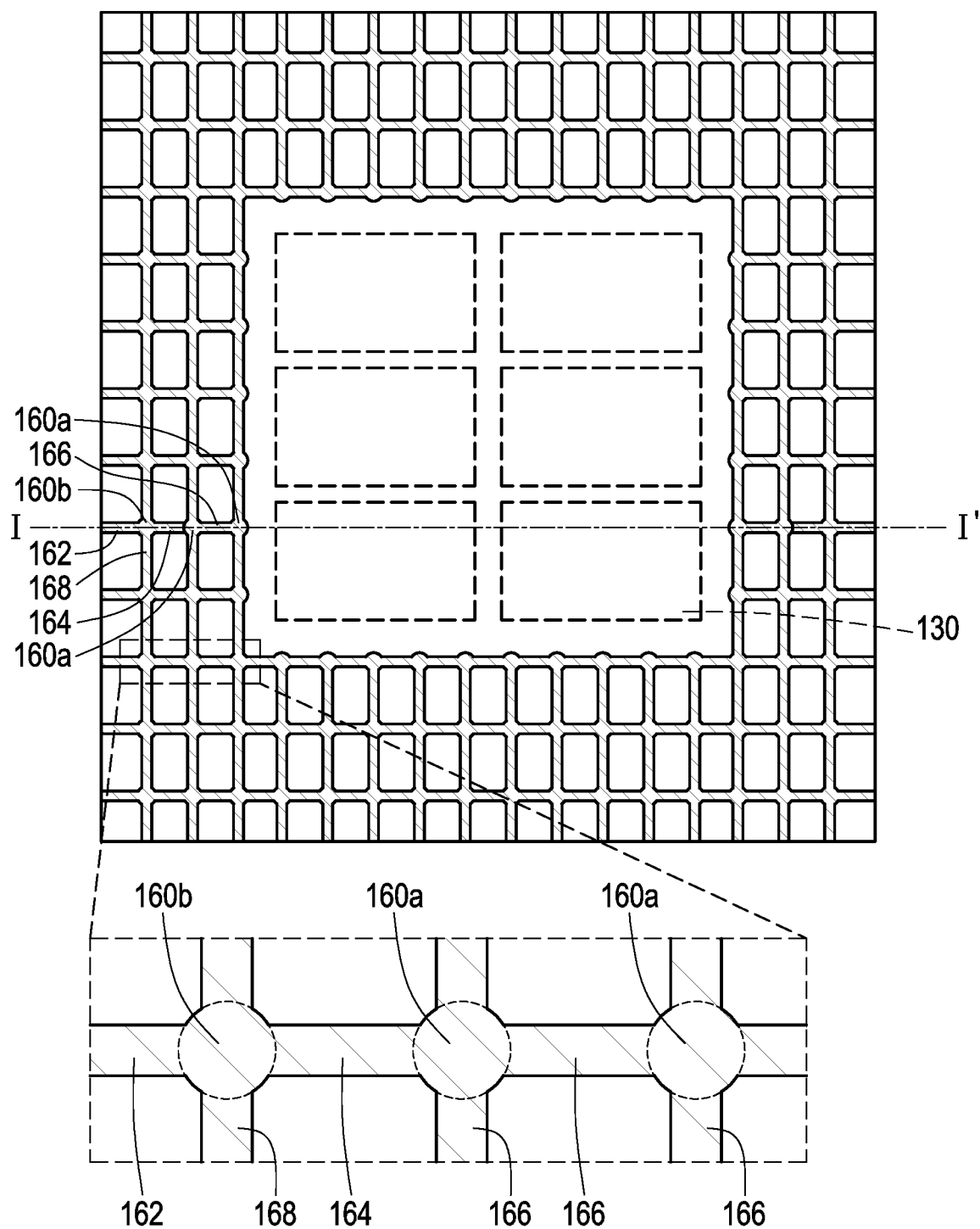
Figure 5:
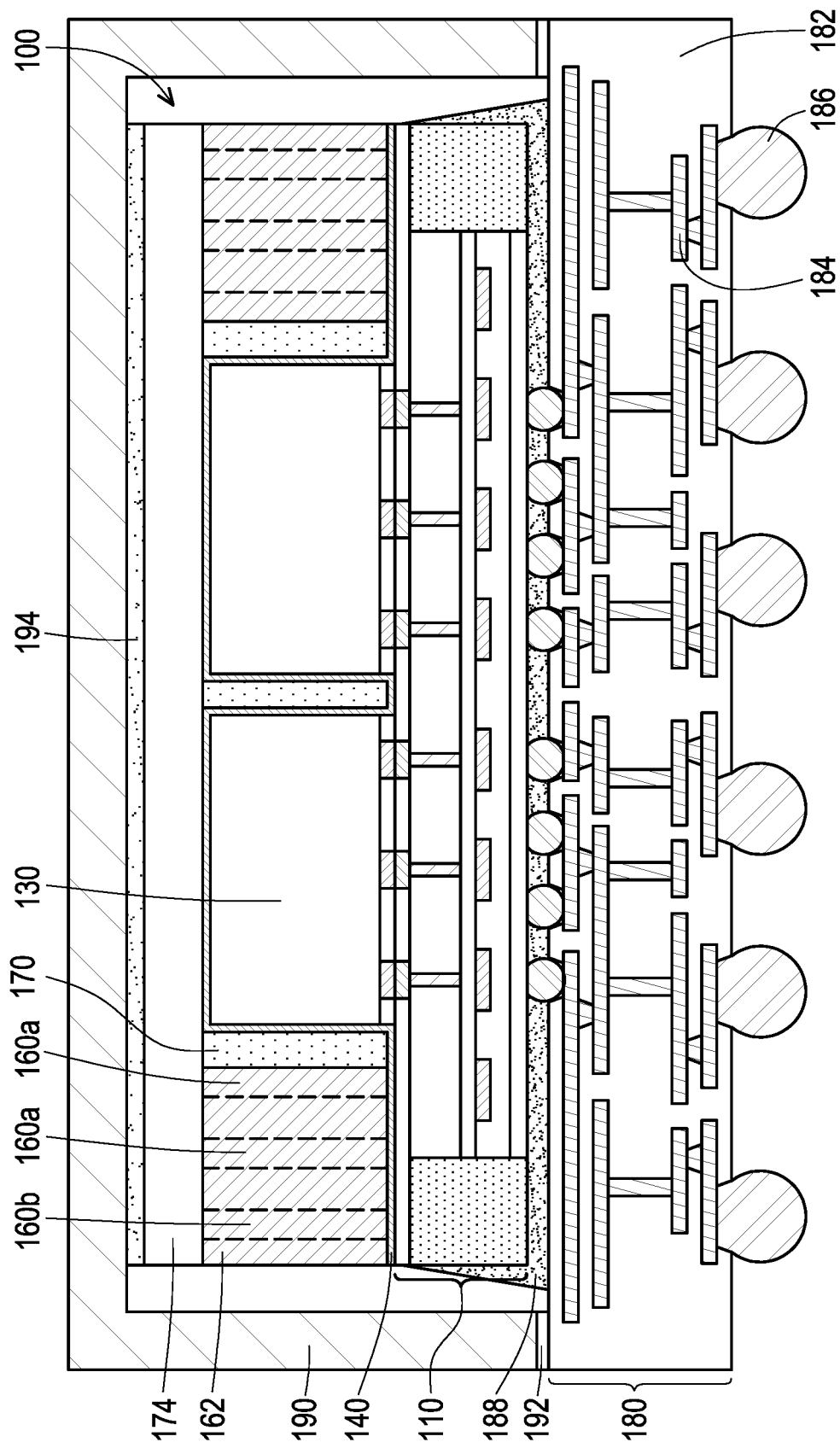
FIG. 5 illustrates a schematic top view of a semiconductor package in accordance with some embodiments of the disclosure.

In some embodiments, adjacent through vias 160a, 160b are physically separated by the encapsulant 170 therebetween. However, the disclosure is not limited thereto. In some embodiments, as shown in FIG. 4A and FIG. 4B (e.g., FIG. 4A is a schematic cross-sectional view along line I-I' of FIG. 4B), adjacent two of the through vias 160a, 160b are physically connected by a connecting part 164, 166, 168 therebetween. For example, the adjacent through vias 160a and 160b are physically connected by the connecting part 164 therebetween, the adjacent through vias 160a are physically connected by the connecting part 166 therebetween, and the adjacent through vias 160b are physically connected by the connecting part 168 therebetween. The configuration, material and forming method of the connecting parts 164, 166, 168 may be similar to or the same as those of the thermal conductive pattern 162. In some embodiments, the connecting parts 164, 166, 168 are line-shaped, respectively. However, the disclosure is not limited thereto. The connecting parts 164, 166, 168 may have other suitable shape. The connecting parts 164, 166, 168 may be formed simultaneously with the through vias 160a, 160b and the thermal conductive pattern 162. For example, as shown in FIG. 4B, the through vias 160a, 160b, the thermal conductive pattern 162 and the connecting parts 164, 166, 168 are integrally formed as a net structure. In other words, no interface exists between the connecting parts 164, 166, 168 and the through vias 160a, 160b. In some embodiments, as shown in FIG. 4A, the connecting parts 164, 166, 168 have a height smaller than the integrated circuits 130. In such embodiments, the encapsulant 170 covers the connecting parts 164, 166, 168, and the encapsulant 172 has a recess 172 exposing at least a portion of through vias 160a and 160b, the thermal conductive pattern 162 and the connecting parts 164, 166, 168. For example, the recess 172 exposes a portion of the through via 160a. In alternative embodiments, the recess 172 is omitted. In alternative embodiments, as shown in FIG. 5, the connecting parts 164, 166, 168 have a height substantially the same as the integrated circuits 130.

Figure 6:
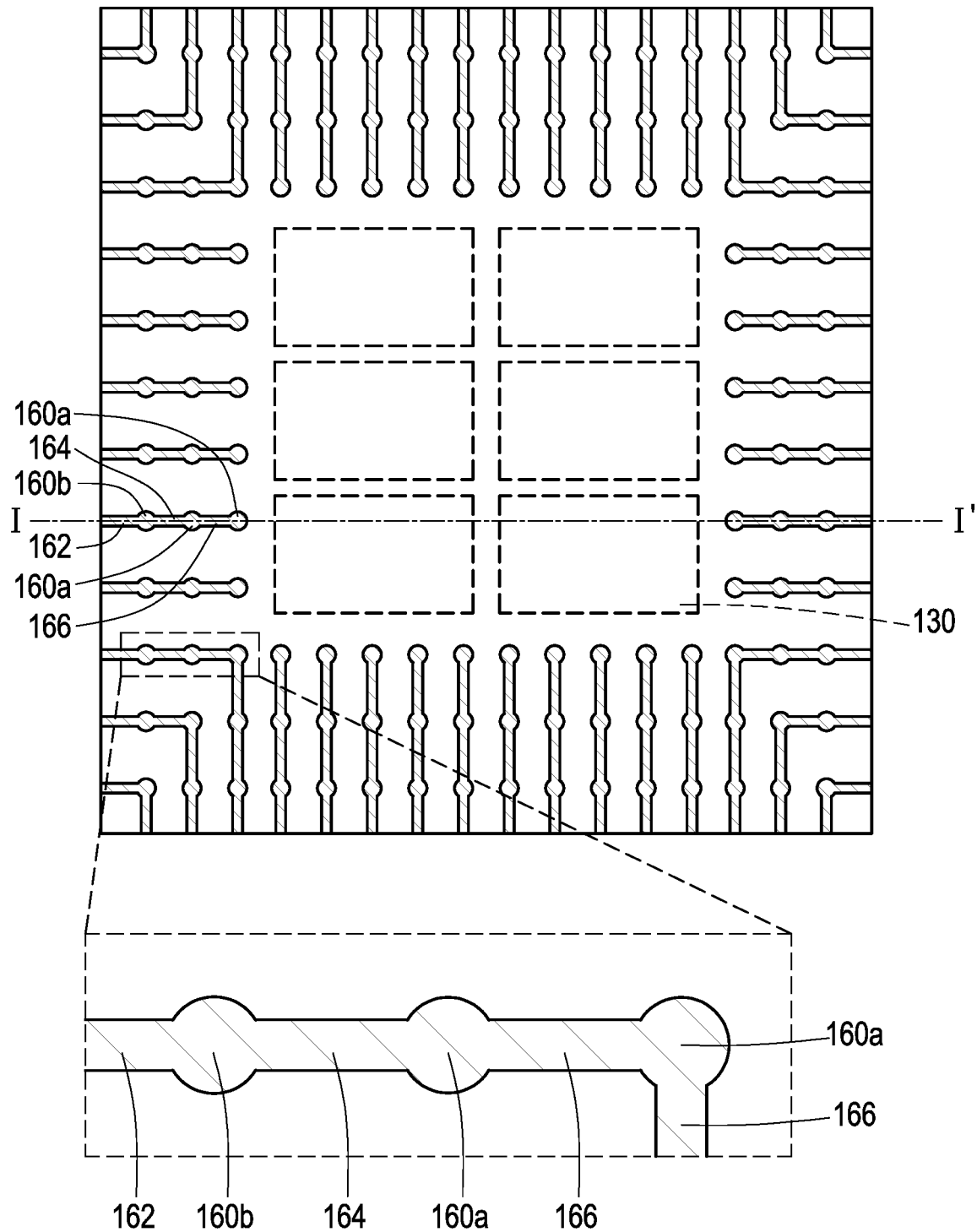
FIG. 6 illustrates a schematic top view of a semiconductor package in accordance with some embodiments of the disclosure.
Figure 7:
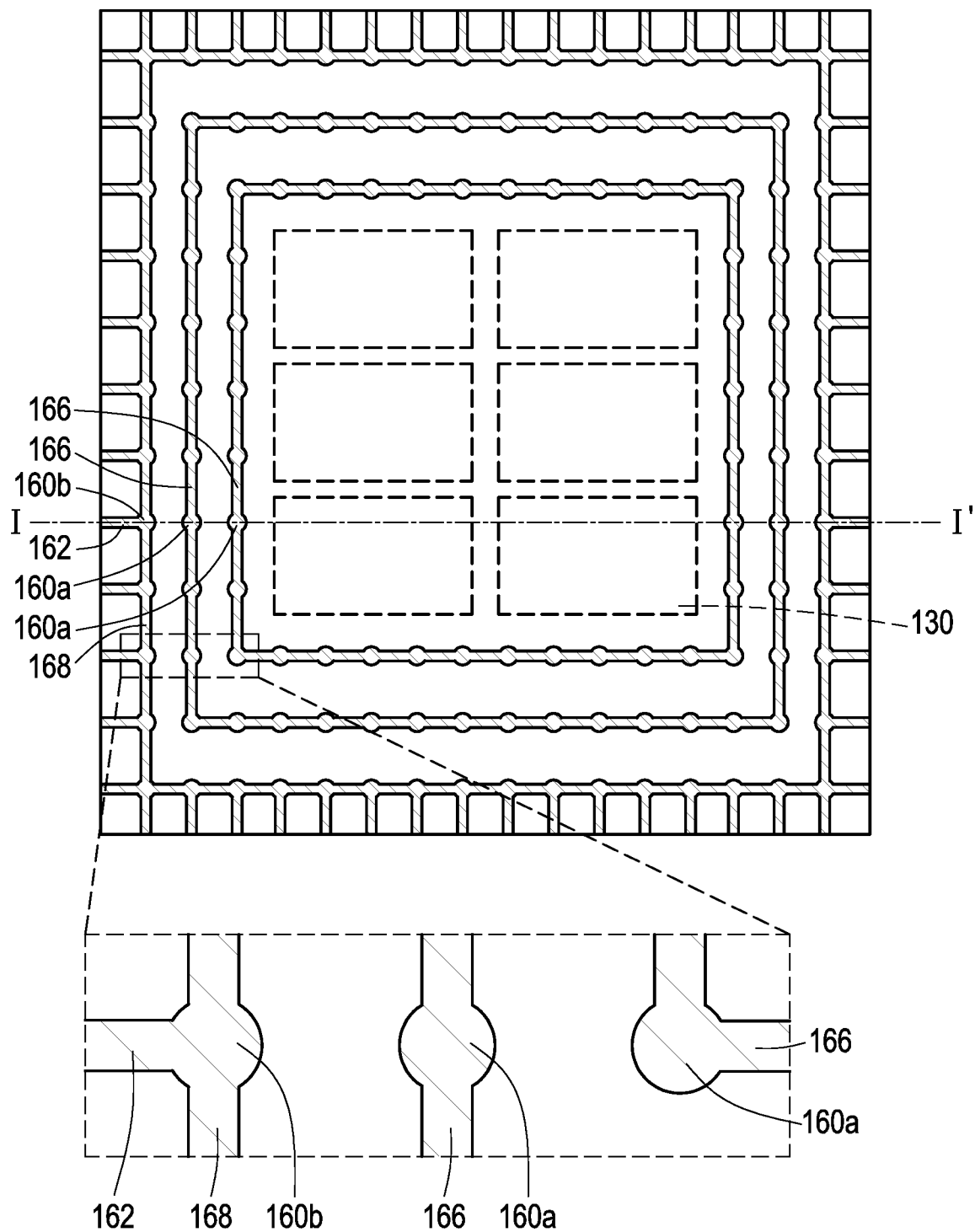
FIG. 7 illustrates a schematic top view of a semiconductor package in accordance with some embodiments of the disclosure.

In some embodiments, at least one of the thermal conductive patterns 162 and the connecting parts 164, 166, 168 may be omitted. For example, as shown in FIG. 6, the through via 160a and the through via 160b are connected while the through vias 160a are physically separated and the through vias 160b are physically separated. Similarly, as shown in FIG. 7, the through vias 160a are connected and the through vias 160b are connected while the through via 160a is physically separated from the through via 160b. In above embodiments, the through vias 160a, 160b, the thermal conductive patterns 162 and/or the connecting parts 164, 166, 168 of the semiconductor package have similar arrangement and/or configuration. However, the disclosure is not limited thereto. The through vias 160a, 160b, the thermal conductive patterns 162 and/or the connecting parts 164, 166, 168 at different regions may have different arrangement and/or configuration. For example, the through vias 160a, 160b, the thermal conductive patterns 162 and/or the connecting parts 164, 166, 168 at one side of the integrated circuit 130 is different from the thermal conductive patterns 162 and/or the connecting parts 164, 166, 168 at another side of the integrated circuit 130. In addition, in some embodiments, the connecting part 168 is configured to physically connect adjacent two through vias 160b. However, the disclosure is not limited thereto. In alternative embodiments, the connecting part 168 is disposed between to physically connect adjacent two thermal conductive patterns 162.

In accordance with some embodiments of the disclosure, a semiconductor package includes a first integrated circuit, a plurality of first through vias and a plurality of fin-shaped through vias. The first through vias surround the first integrated circuit. The fin-shaped through vias are physically connected to the first through vias respectively, wherein the first through vias are disposed between the first integrated circuit and the fin-shaped through vias.

In accordance with some embodiments of the disclosure, a semiconductor package includes a first integrated circuit, a plurality of first through vias, a plurality of second through vias and a first connecting part. The first through vias surround the first integrated circuit. The second through vias surround the first integrated circuit, and the first through vias are disposed between the second through vias and the first integrated circuit. The first connecting part physically connects one of the first through vias and one of the second through vias.

In accordance with some embodiments of the disclosure, a semiconductor package includes a first integrated circuit, at least one second integrated circuit, a plurality of first through vias, a plurality of thermal conductive patterns and an encapsulant. The second integrated circuit is bonded to the first integrated circuit. The first through vias surround the at least one second integrated circuit over the first integrated circuit. The first through vias are disposed between the thermal conductive patterns and the at least one second integrated circuit. The encapsulant encapsulates the at least one second integrated circuit, wherein a sidewall of the thermal conductive pattern is substantially flush with a sidewall of the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. Semiconductor package, comprising:
   a first integrated circuit;
   a plurality of first through vias surrounding the first integrated circuit; and
   a plurality of fin-shaped through vias physically connected to the first through vias respectively, wherein the first through vias are disposed between the first integrated circuit and the fin-shaped through vias.

2. The semiconductor package of claim 1, wherein a width of the first through via is different from a width of the fin-shaped through via physically connected thereto.

3. He semiconductor package of claim 1 further comprising a second integrated circuit, wherein the first integrated circuit, the first through vias and the fin-shaped through vias are disposed on the second integrated circuit.

4. He semiconductor package of claim 1, wherein top surfaces of the first through vias and the fin-shaped through vias are disposed between a top surface and a bottom surface of the first integrated circuit.

5. He semiconductor package of claim 1 further comprising a second integrated circuit and an encapsulant encapsulating the second integrated circuit, wherein the first integrated circuit, the first through vias and the fin-shaped through vias are disposed on the second integrated circuit, and a sidewall of the fin-shaped through via is substantially flush with a sidewall of the encapsulant.

6. He semiconductor package of claim 1 further comprising an encapsulant covering the first through vias and the fin-shaped through vias, wherein a sidewall of the fin-shaped through via is substantially flush with a sidewall of the encapsulant.

7. The semiconductor package of claim 6, wherein a top surface of the encapsulant is coplanar with a top surface of the first integrated circuit.

8. He semiconductor package of claim 1 further comprising a seed layer, wherein the seed layer is continuously disposed beneath the first through vias and the fin-shaped through vias and on a sidewall and a surface of the first integrated circuit.

9. Semiconductor package, comprising:
   a first integrated circuit;
   a plurality of first through vias surrounding the first integrated circuit, wherein one of the first through vias has a sidewall and a first surface;
   a plurality of second through vias surrounding the first integrated circuit, the first through vias disposed between the second through vias and the first integrated circuit;
   a first connecting part, wherein the first connecting part physically connects one of the first through vias and one of the second through vias; and
   an encapsulant, encapsulating the first integrated circuit and the first through vias, wherein the encapsulant covers the first surface of the one of the first through vias.

10. He semiconductor package of claim 9, wherein a width of the first connecting part is different from a diameter of the one of the first through vias and a diameter of the one of the second through vias, a height between opposite surfaces of the first connecting part is equal to a height between the first surface and a second surface opposite to the first surface of the one of the first through vias.

11. The semiconductor package of claim 9, wherein a width of the first connecting part is smaller than a diameter of the one of the first through vias and a diameter of the one of the second through vias.

12. The semiconductor package of claim 9 further comprising a second connecting part, wherein the second connecting part physically connects adjacent two of the second through vias.

13. He semiconductor package of claim 12, wherein the first connecting part is connected to the second connecting part through the second through via therebetween.

14. He semiconductor package of claim 9, wherein the first connecting part is line-shaped.

15. The semiconductor package of claim 9, wherein no interface exists between the first connecting part and the one of the first through vias and between the first connecting part and the one of the second through vias.

16. Semiconductor package, comprising:
a first integrated circuit;
at least one second integrated circuit bonded to the first integrated circuit;
a plurality of first through vias surrounding the at least one second integrated circuit over the first integrated circuit;
a plurality of thermal conductive patterns, the first through vias disposed between the thermal conductive patterns and the at least one second integrated circuit; and
an encapsulant encapsulating the at least one second integrated circuit, wherein a sidewall of the thermal conductive pattern is substantially flush with a sidewall of the encapsulant.

17. He semiconductor package of claim 16 further comprising a heat spreader, wherein the heat spreader surrounds the first integrated circuit, the at least one second integrated circuit, the first through vias and the thermal conductive patterns.

18. He semiconductor package of claim 16 further comprising a heat spreader, wherein the heat spreader covers the at least one second integrated circuit, the first through vias and the thermal conductive patterns.

19. He semiconductor package of claim 16, wherein the encapsulant exposes at least one of the first through vias and the thermal conductive patterns.

20. The semiconductor package of claim 16, wherein a surface of the encapsulant is substantially coplanar with a surface of the at least one second integrated circuit.

* * * * *